(12) United States Patent  
Kim et al.

(10) Patent No.: US 8,237,255 B2  
(45) Date of Patent: Aug. 7, 2012

(54) MULTI-LAYER PRINTED CIRCUIT BOARD HAVING BUILT-IN INTEGRATED CIRCUIT PACKAGE

(75) Inventors: Sang-Hyun Kim, Seongnam-si (KR); Shi-Yun Cho, Seoul (KR); Young-Min Lee, Yongin-si (KR); Kyu-Sub Kwak, Suwon-si (KR); Youn-Ho Choi, Seoul (KR)

(73) Assignee: Samsung Electronics Co., Ltd (KR)

( * ) Notice: Subject to any disclaimer, the term of this patent is extended or adjusted under 35 U.S.C. 154(b) by 274 days.

(21) Appl. No.: 12/633,433

(22) Filed: Dec. 8, 2009

(65) Prior Publication Data

US 2010/0140782 A1    Jun. 10, 2010

(30) Foreign Application Priority Data

Dec. 8, 2008    (KR) .................. 10-2008-0124057

(51) Int. Cl.  
*H01L 23/48* (2006.01)

(52) U.S. Cl. ........ 257/690; 257/698; 257/700; 257/713; 257/737; 257/E21.499; 257/E23.019

(58) Field of Classification Search .................. 257/690, 257/698, 713, 737, E21.499, E23.019  
See application file for complete search history.

(56) References Cited

U.S. PATENT DOCUMENTS

| | | | |
|---|---|---|---|
| 7,282,394 B2* | 10/2007 | Cho et al. ...................... | 438/118 |
| 7,414,309 B2* | 8/2008 | Oi et al. ......................... | 257/700 |
| 7,842,887 B2* | 11/2010 | Sakamoto et al. ............. | 174/260 |
| 7,894,203 B2* | 2/2011 | Kariya et al. .................. | 361/768 |
| 8,053,681 B2* | 11/2011 | Jung et al. ..................... | 174/264 |
| 2009/0316373 A1* | 12/2009 | Kim et al. ...................... | 361/764 |

* cited by examiner

*Primary Examiner* — Andy Huynh  
(74) *Attorney, Agent, or Firm* — The Farrell Law Firm, P.C.

(57) ABSTRACT

A Printed Circuit Board (PCB) is provided in which at least one built-in Integrated Circuit (IC) package has a plurality of conductive bumps on an IC. The plurality of conductive bumps are for external electrical connection. The IC package is accommodated within a core layer of a multi-layer PCB by a connection member on the IC. The connection member is formed between the conductive bumps and the core layer with contact holes in contact with the conductive bumps. The conductive bumps are electrically connected through conductor layers formed in the contact holes.

7 Claims, 11 Drawing Sheets

MULTI-LAYER PRINTED CIRCUIT BOARD HAVING BUILT-IN INTEGRATED CIRCUIT PACKAGE

PRIORITY

This application claims priority under 35 U.S.C. §119(a) to a Korean Patent Application filed in the Korean Intellectual Property Office on Dec. 8, 2008 and assigned Serial No. 10-2008-0124057, the entire disclosure of which is incorporated herein by reference.

BACKGROUND OF THE INVENTION

1. Field of the Invention

The present invention relates generally to Integrated Circuit (IC) devices, and more particularly, to a multi-layer Printed Circuit Board (PCB) having an IC package built therein and a method for fabricating the PCB.

2. Description of the Related Art

In order to satisfy increasing demands for smaller-sized, slim electronic devices and their various additional functions, high integration technology is essential. A conventional PCT has Surface Mount Device (SMD) components. However, techniques have been proposed, in which components are built within a PCB, allowing for the integration of more components.

One such technique builds an IC in a PCB by re-wiring the IC in a Wafer Level Package (WLP). The PCB with the built-in IC package provides sophisticated functionality along with miniaturization and function diversity. Thus, the PCB minimizes a wiring distance for a high frequency of 100 MHz or higher, and in some cases overcomes a reliability problem encountered through connections produced by wire bonding or a solder ball as used for a Flexible Circuit Board (FCB) or a Ball Grid Array (BGA).

FIGS. 1 to 3B illustrate structures of conventional PCBs each having one or more built-in IC packages.

Figure 1:
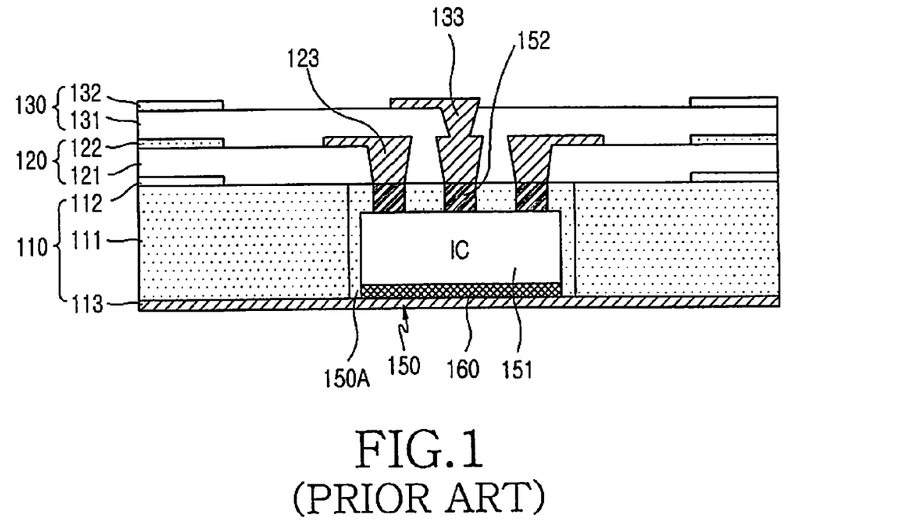
FIG. 1 is a sectional diagram of a conventional PCB with a built-in IC package.

FIG. 1 is a schematic view illustrating a structure of the conventional PCB with a built-in IC package. A multi-layer PCB includes a core layer 110 having a core insulation layer 111 and core conductive layers 112 and 113. The multi-layer PCB also includes build-up layers 120 and 130 in which insulation layers 121 and 131 and conductive layers 122 and 132 are alternately deposited. Via holes 123 and 133 are formed into the insulation layers 121 and 131 for an electrical connection between layers and to the outside. A WLP 150 is provided with a plurality of conductive bumps 152 on a top surface of an IC 151 for external electrical connection. The WLP 150 is accommodated within a cavity 150A formed into the core insulation layer 111 of the multi-layer PCB. The WLP 150 has a die attach film 160 attached onto a surface of the IC 151 that does not have the conductive bumps 152. The die attach film 160 is also attached to the bottom of the cavity, specifically, to the core conductive layer 113 under the core insulation layer 111.

Conventionally, a fan-out operation connects the built-in IC package to the outside through the formation of a cavity by peeling off the copper foil of a core conductive layer and performing wiring via holes formed by applying a laser beam to a layer built up on the core layer. Therefore, at least one build-up layer is required for the fan-out operation. When there are a large number of interconnections with the outside, a plurality of build-up layers are needed, thereby increasing the cost of the PCB.

Figure 2A:
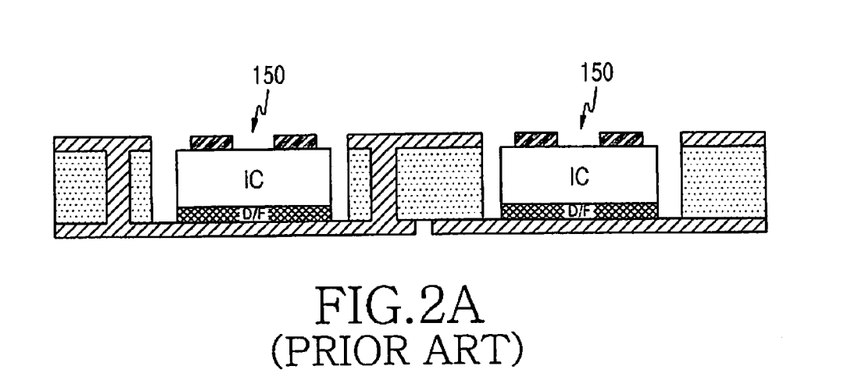
FIGS. 2A and 2B is a diagram illustrating built-in directions of IC packages in conventional PCBs.
Figure 2B:
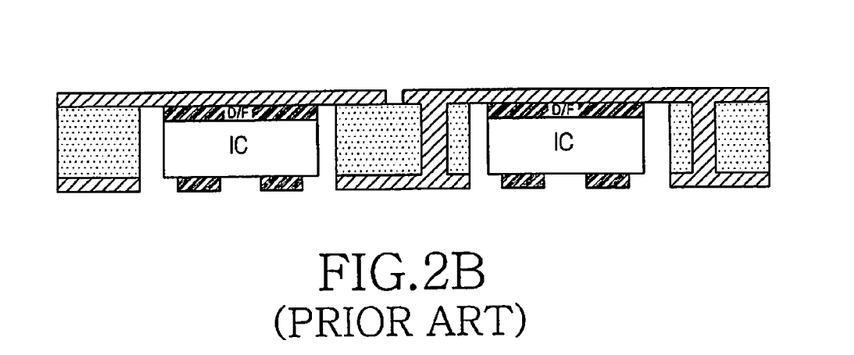

Moreover, when a plurality of IC packages are arranged on the PCB, two or more IC packages 150 are usually built in one direction in the conventional technology, as illustrated in FIGS. 2A and 2B. Thus it is difficult to change the built-in directions of the IC packages to be different from each other.

Figure 3A:
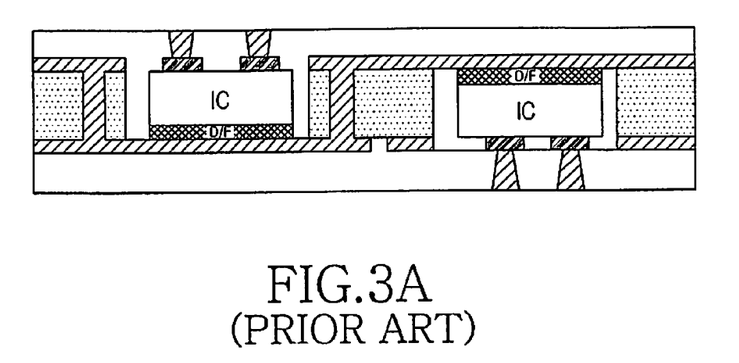
FIGS. 3A and 3B is a diagram illustrating simulated built-in directions of IC packages in a conventional PCB.
Figure 3B:
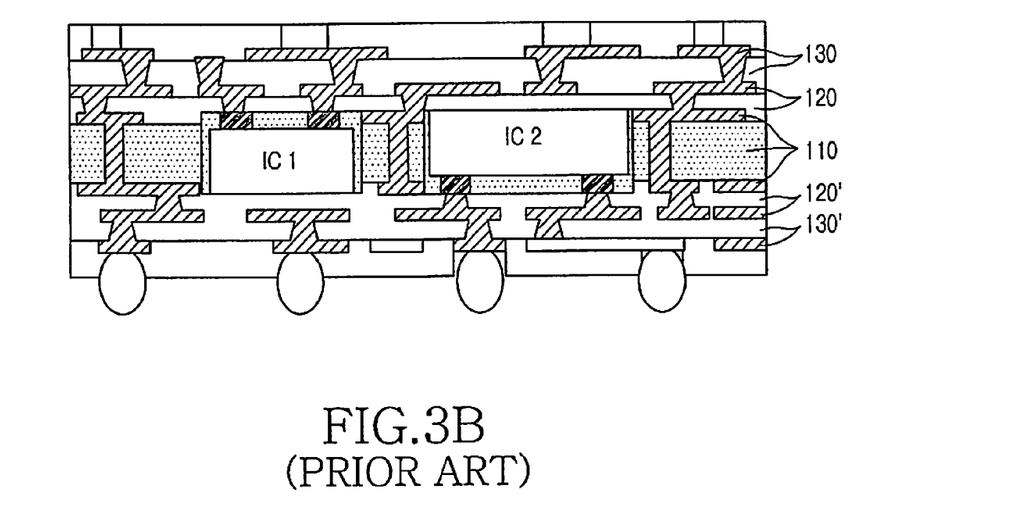

When two IC packages are built in opposite directions as illustrated in FIG. 3A, the same process is repeated and both surfaces of the core layer 110 may not be utilized. As a result, more build-up layers 120, 120', 130 and 130' are used as illustrated in FIG. 3B, thereby increasing the cost.

SUMMARY OF THE INVENTION

The present invention has been made to address at least the above problems and/or disadvantages and to provide at least the advantages described below. Accordingly, an aspect of the present invention provides a PCB with a built-in IC package and a method for fabricating the PCB with the built-in IC package, which can reduce the number of build-up layers during fabrication of the PCB with the built-in IC package.

Another aspect of the present invention provides a PCB with a built-in IC package and a method for fabricating the PCB with the built-in IC package, which can increase wiring freedom by enabling free control of the built-in direction of an IC.

According to one aspect of the present invention, a PCB is provided having at least one built-in IC package. The at least one built-in IC package has a plurality of conductive bumps on an IC for external electrical connection. The at least one built-in IC package is accommodated within a core layer of a multi-layer PCB by a connection member on the IC. The connection member is formed between the conductive bumps and the core layer with contact holes in contact with the conductive bumps. The conductive bumps are electrically connected through conductor layers formed in the contact holes.

According to another aspect of the present invention, a method is provided for fabricating a PCB with at least one built-in IC package having a plurality of conductive bumps on an IC, for external electrical connection. First and second conductive layers are formed on upper and lower surfaces of a core insulation layer, respectively. A via hole is formed for an electrical connection between the upper and lower surfaces. A core conductive layer circuit pattern is selectively formed. A first cavity opened in a first direction is formed for accommodating an IC package in the core insulation layer. The IC package is accommodated in the first cavity so that a connection member is interposed between the conductive bumps and the first conductive layer. A contact hole is formed by selectively eliminating the first and second conductive layers and the connection member in areas where the first and second conductive layers and the connection member overlap the conductive bumps, to expose the conductive bumps. A connection wire is formed in the contact hole to connect the conductive bumps to the first or second conductive layer.

BRIEF DESCRIPTION OF THE DRAWINGS

The above and other aspects, features and advantages of the present invention will be more apparent from the following detailed description when taken in conjunction with the accompanying drawings, in which.

DETAILED DESCRIPTION OF EMBODIMENTS OF THE PRESENT INVENTION

Embodiments of the present invention are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

Figure 4:
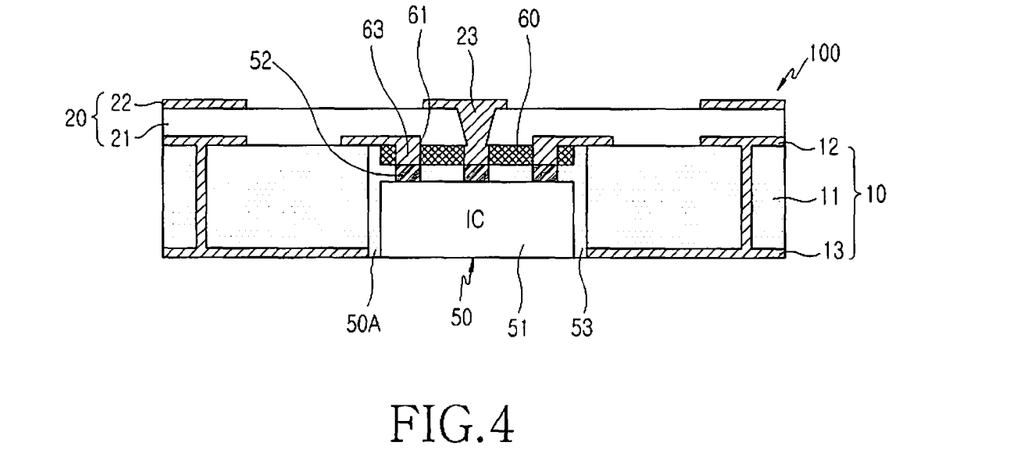
FIG. 4 is a diagram illustrating the structure of a PCB with a built-in IC package, according to an embodiment of the present invention.

FIG. 4 is a diagram illustrating the structure of a PCB with a built-in IC package, according to an embodiment of the present invention. The PCB has a single built-in IC package, by way of example.

The PCB with the built-in IC package includes a multi-layer PCB 100 and an IC package 50. The multi-layer PCB 100 has a core layer 10 and a build-up layer 20 that is deposited on the core layer 10. The IC package 50, which is placed into the core layer 10 and fixed by a connection member 60, includes a plurality of conductive bumps 52 on an IC 51, for external electrical connection.

The core layer 10 has a core insulation layer 11, and core conductive layers 12 and 13 formed on the top and bottom surfaces of the core insulation layer 11, respectively. The core layer 10 is a raw layer upon which the PCB is fabricated. For example, the core layer 10 is provided with the core conductive layers 12 and 13 formed by coating an FR4 core insulation layer 11 with copper foils. The core layer 10 has a cavity 50A for accommodating the IC package 50 therein.

The build-up layer 20 includes a build-up insulation layer 21 formed on the core layer 10, a build-up conductive layer 22 formed on the build-up insulation layer 21, and a via hole 23 formed through the build-up conductive layer 22 and the build-up insulation layer 21, for electrical connection between layers. While a single build-up layer is deposited on the IC package in the structure of FIG. 4, a PCB may be fabricated to have more layers by depositing a predetermined number of build-up layers on the top surface of the build-up layer 20 and the bottom surface of the core layer 10.

The IC package 50 is, for example, a WLP and has the plurality of conductive bumps 52, which are rearranged on larger pads other than input and output pads of the chip of the IC 51 through re-wiring.

The IC package 50 is fully contained in the cavity 50A and fixed by, for example, a die attach film 60, within the core layer 10 of the PCB 100. The die attach film 60 is interposed between the top surface of the conductive bumps 52 and the core conductive layer 12. Connection conductors 63 are formed by filling a conductor into contact holes 61, which are formed on the top surface of the conductive bumps 52. Thus, the conductive bumps 52 are directly connected to the core conductive layer 12. Specifically, the conductive bumps 52 are configured to be electrically connected to the outside through the core conductive layer 12. In the conventional structure illustrated in FIG. 1, the conductive bumps 152 are connected to the first build-up conductive layer 122 through the via hole 123 formed into the first build-up insulation layer 121 on the core insulation layer 111. Thus, the number of build-up layers can be reduced in accordance with an embodiment of present invention.

Figure 5:
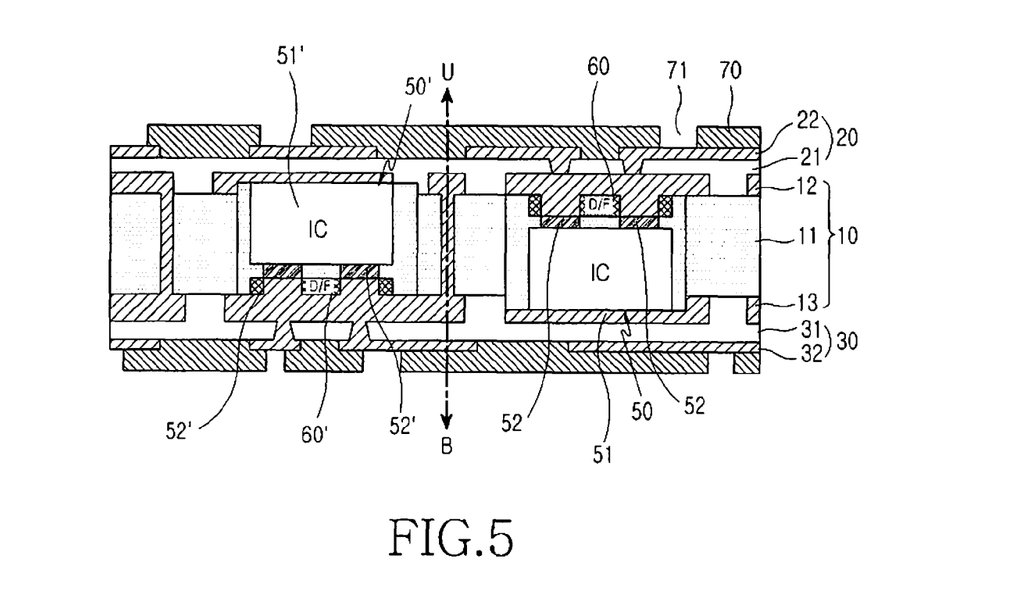
FIG. 5 is a sectional diagram of a PCB with built-in IC packages, according to another embodiment of the present invention.

FIG. 5 is a sectional diagram of a PCB with built-in IC packages, according to another embodiment of the present invention. This PCB has two built-in IC packages 50 and 50'. The basic principle of a PCB with a single built-in IC package is extended to a PCB having two built-in IC packages directed in opposite directions (180 degrees) in the embodiment illustrated in FIG. 5.

The IC package 50 has the conductive bumps 52 directed toward a top (U) of the PCB, and the other IC package 50' has conductive bumps 52' directed toward a bottom (B) of the PCB. In addition, a build-up layer 30 is additionally formed on a bottom surface of the core layer 10. The IC packages 50 and 50' are almost symmetrical at 180 degrees along a line UB. When two IC packages are arranged in opposite directions in this manner, both the core conductive layers 12 and 13 on the top and bottom surfaces of the core insulation layer 11 may be used as fan-out layers, thus decreasing the number of build-up layers. Also, the built-in direction of an IC package can be changed freely according to the interconnection between an IC and the outside. Hence, wiring freedom is improved for fan-out.

FIGS. 6A to 6J are sectional diagrams sequentially illustrating a method for fabricating the PCB with the built-in IC packages illustrated in FIG. 5, according to an embodiment of the present invention. The PCB structure on the right side of the UB line of FIG. 5 is identical to that illustrated in FIG. 4. Therefore, the fabrication method illustrated in FIGS. 6A to 6J is also applicable to the PCB structure of FIG. 4.

Figure 6A:
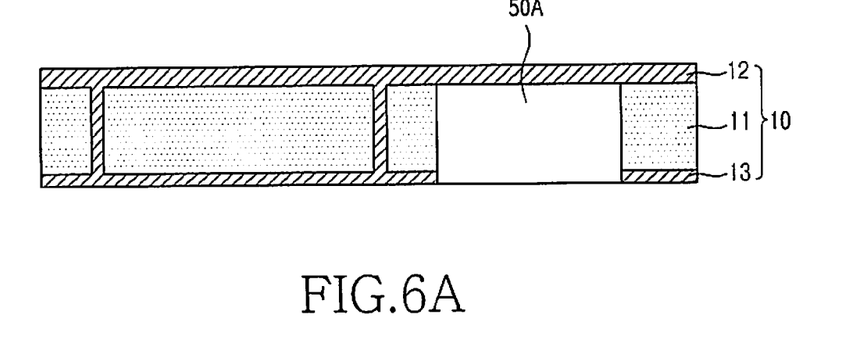
FIGS. 6A to 6J are sectional diagrams sequentially illustrating a method for fabricating the PCB with the built-in IC packages illustrated in FIG. 5, according to an embodiment of the present invention.

FIG. 6A illustrates the step of forming the first cavity 50A into the core layer 10 for accommodating the IC package therein in a first direction. The first direction is a direction in which an IC package or IC packages are disposed such that the conductive bumps 52 are directed toward the top (U) of the PCB as illustrated in FIG. 5. In this embodiment of the present invention, one IC package is built in the first direction. However, when needed, a plurality of IC packages may be built in the first direction. Accordingly, the number of cavities formed is equal to the number of first-direction IC packages. The first cavity 50A is a bottom-opened cavity formed by a general drilling process according to the size of the IC package 50 that will be accommodated in the first cavity 50A. To facilitate the accommodation of the IC package 50 in the first cavity 50A, gaps may be formed between inner walls of the first cavity 50A and the IC package 50.

Figure 6B:
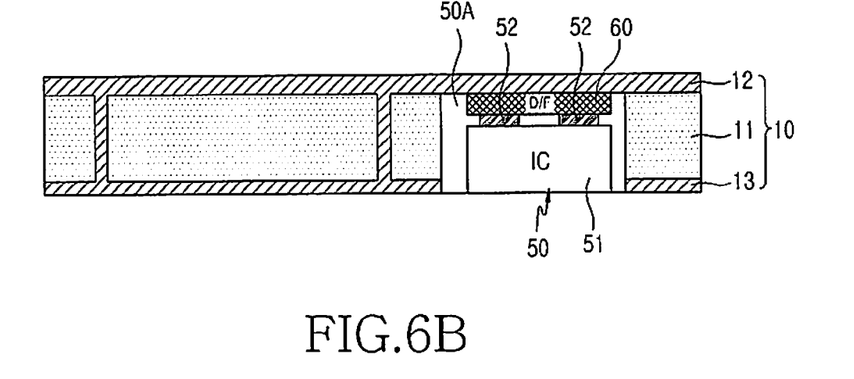

FIG. 6B illustrates the step of accommodating the IC package 50 within the first cavity 50A. The IC package 50 having a plurality of conductive bumps 52 formed on its top surface is prepared and the die attach film 60 is attached onto the conductive bumps 52. The IC package 50 is then placed in the first cavity 50A. As the die attach film 60 is attached to the conductive layer 12, the IC package 50 is fixed in the first direction within the first cavity 50A.

Figure 6C:
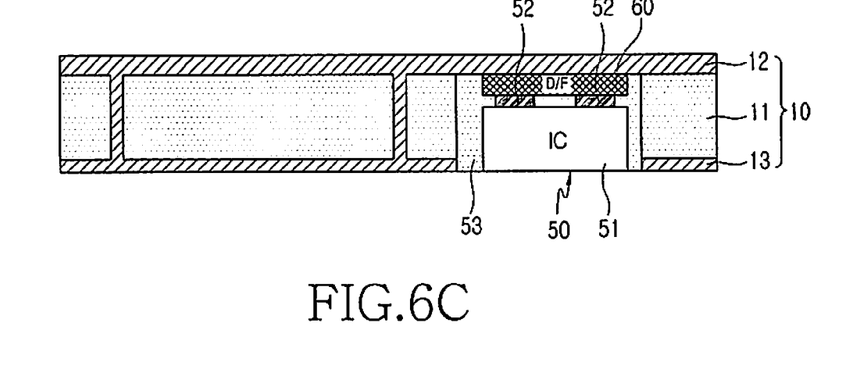

FIG. 6C illustrates the step of filling a resin layer 53 in the gaps between the inner walls of the first cavity 50A and the IC package 50, to eliminate voids in the first cavity 50A.

Figure 6D:
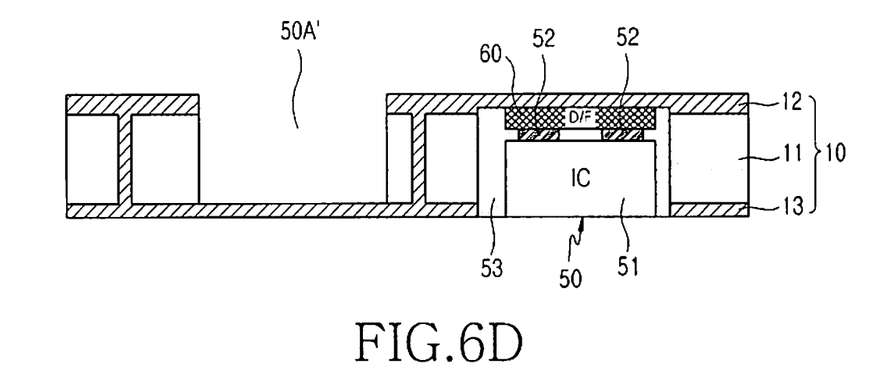

FIG. 6D illustrates the step of forming the second cavity 50A' into the core layer 10, for accommodating the IC package 50' therein in a second direction. The second direction is a direction in which the IC package 50' or IC packages 50' are disposed so that conductive bumps 52' are directed toward the bottom (B) of the PCB. This corresponds to a 180-degree rotation of the IC package 50 illustrated in FIG. 5. While one IC package is built in the second direction in this embodiment of the present invention, a plurality of IC packages may be built in the second direction when needed. Accordingly, the number of cavities formed is equal to the number of second-direction IC packages. The second cavity 50A' is a top-opened cavity formed by a general drilling process according to the size of the IC package 50' to be accommodated in the second cavity 50A'. To facilitate the accommodation of the IC package 50' in the second cavity 50A', gaps may be formed between inner walls of the second cavity 50A' and the IC package 50'.

Figure 6E:
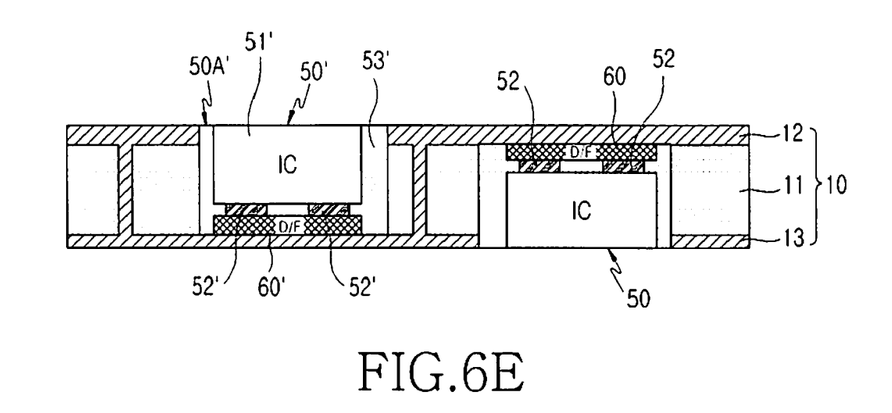

FIG. 6E illustrates the step of accommodating the IC package 50' within the second cavity 50A' in the second direction and filling a resin layer 53' in the gaps between the inner walls of the second cavity 50A' and the IC package 50'. The IC package 50' having a plurality of conductive bumps 52' is prepared and a die attach film 60' is attached to the conductive bumps 52'. The IC package 50' is then placed in the second cavity 50A'. As the die attach film 60' is attached to the conductive layer 13, the IC package 50' is fixed in the second direction within the second cavity 50A'. Subsequently, the resin layer 53' is filled into the second cavity 50' to eliminate voids in the second cavity 50A'.

Figure 6F:
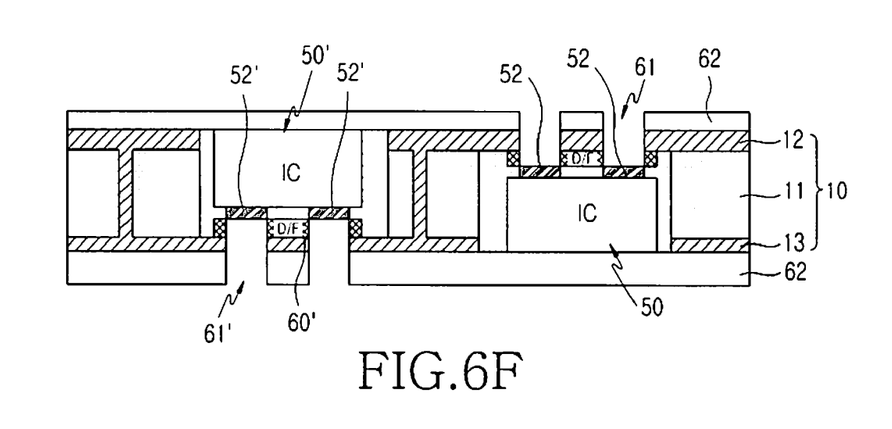

FIG. 6F illustrates the step of exposing the top surfaces of the conductive bumps 52 and 52' by eliminating portions of the die attach films 60 and 60' and the core conductive layers 12 and 13, and thus forming contact holes 61 and 61', respectively. The contact holes 61 and 61' are formed by masking in a general photolithography process and drilling using a laser. Specifically, photoresists are deposited on the top and bottom surfaces of the core conductive layers 12 and 13 and mask patterns 62 are formed by photolithography so that the core conductive layers 12 and 13 over the conductive bumps 52 and 52' are exposed. Then the die attach films 60 and 60' on the conductive bumps 52 and 52' are exposed by etching the core conductive layers 12 and 13 using the mask patterns 62 as etching masks. The exposed die attach films 60 and 60' are eliminated by a laser drill, thereby forming the contact holes 61 and 61' and thus exposing the conductive bumps 52 and 52'.

Figure 6G:
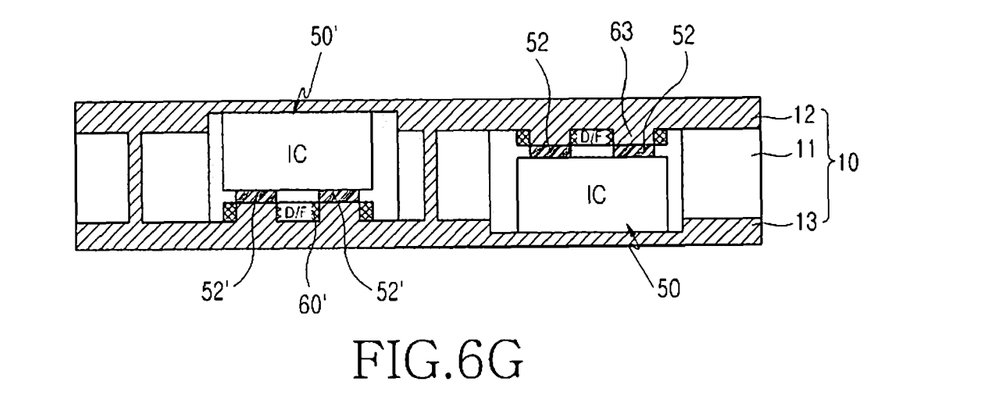

FIG. 6G illustrates the step of forming connection conductors (conductor layers) 63 of a conductive material in the contact holes 61 and 61' and eliminating the mask patterns 62. After the contact holes 61 and 61' are formed, the insides of the contact holes 61 and 61' are plated by a plating process using the same material as the core conductive layers 12 and 13, for example, by electro copper plating. Thus, the conductive bumps 52 and 52' are connected to the core conductive layers 12 and 13. The contact holes 61 and 61' are filled with a conductive material and the mask patterns are eliminated. The core layer is utilized as a fan-out layer so that the conductive bumps 52 and 52' are directly electrically connected to the core conductive layers 12 and 13 through the holes formed in the die attach films 60 and 60' on the conductive bumps 52 and 52'. Thus, the number of build-up layers can be reduced, compared to the conventional PCB structure illustrated in FIG. 1 in which the conductive bumps 152 are connected to the first build-up layer 122 through the via holes 123 formed into the first build-up insulation layer 121 on the core insulation layer 111.

Figure 6H:
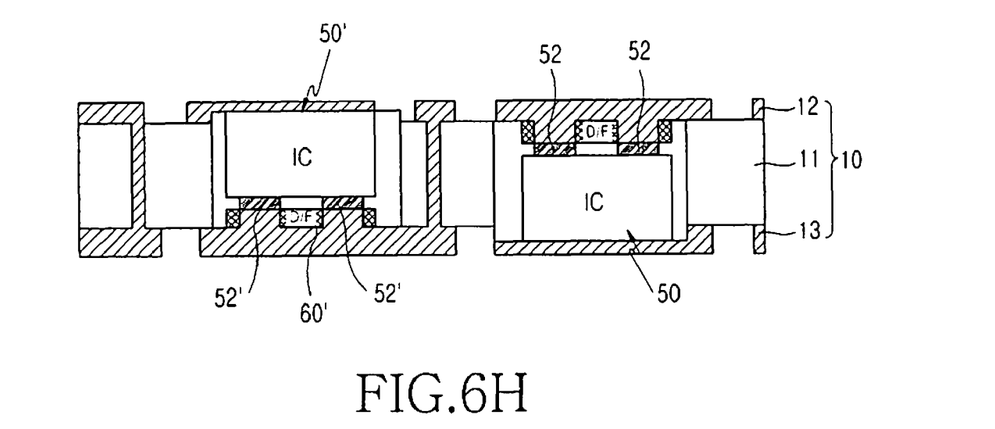

FIG. 6H illustrates the step of patterning the core conductive layers 12 and 13. First, etching masks (not shown) are formed to pattern the core conductive layers 12 and 13. To form an etching mask, for example, a circuit pattern printed on an art work film may be transferred onto the core layer. Many transfer methods are available. Typically, the circuit pattern printed on the art work film is transferred onto a photosensitive dry film by ultraviolet light. A Liquid Photo Resist (LPR) may be used instead of the dry film. The dry film or LPR with the circuit pattern transferred thereon serves as an etching mask. When the core layer is immersed in an etchant, the core layers 12 and 13 are patterned into predetermined circuit patterns, as illustrated in FIG. 6H.

Figure 6I:
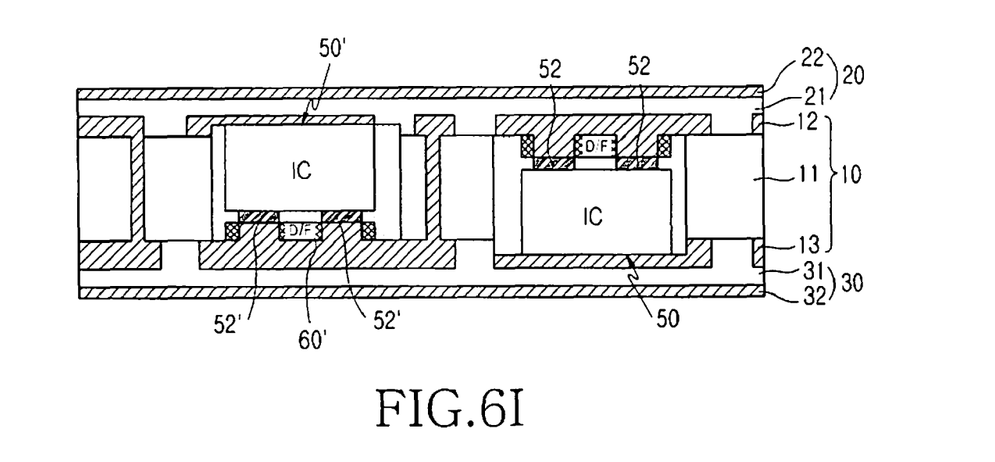

FIG. 6I illustrates the step of forming the first and second build-up layers 20 and 30 on the top surface of the core conductive layer 12 and the bottom surface of the core conductive layer 13, respectively. The first build-up layer 20 includes the build-up insulation layer 21, a via hole (not shown), and the build-up conductive layer 22. The second build-up layer 30 includes a build-up insulation layer 31, a via hole (not shown), and a build-up conductive layer 32. The first and second build-up layers 20 and 30 are formed by a general build-up process. Specifically, the build-up insulation layers 21 and 31 are formed on the top and bottom surfaces of the core layer 11, respectively. Subsequently, the build-up conductive layers 22 and 32 are formed by a plating process that has formed the via holes using laser light.

Figure 6J:
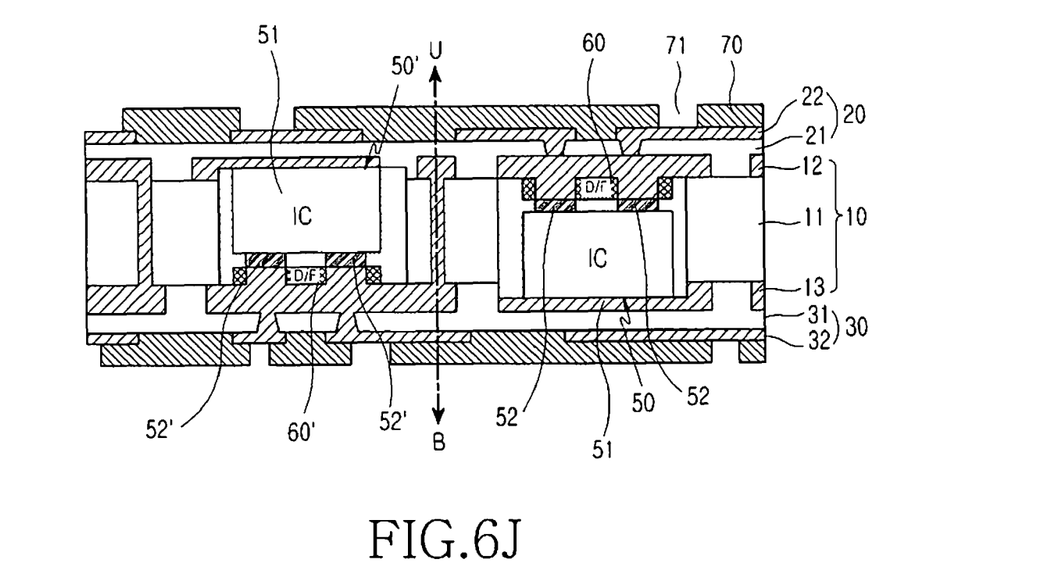

FIG. 6J illustrates the step of forming the build-up conductive layers 22 and 32 into circuit patterns in the same manner as the method for forming a core conductive layer circuit pattern. Solder resist layers 70 and openings 71 are then formed on the top and bottom surfaces of the build-up layers 20 and 30. The PCB with the built-in IC packages according to the present invention is fabricated in this manner. When a PCB with more layers is to be fabricated, as many build-up layers as required are deposited on the top surface of the first build-up layer and on the bottom surface of the second build-up layer, and then the solder resist layers are formed on the outermost conductive layers of the build-up layers. The solder resist layers protect the conductive layers (copper foils thereof) against oxidation, improve the soldering characteristics of mounted parts, and provide good conductivity.

Figure 7:
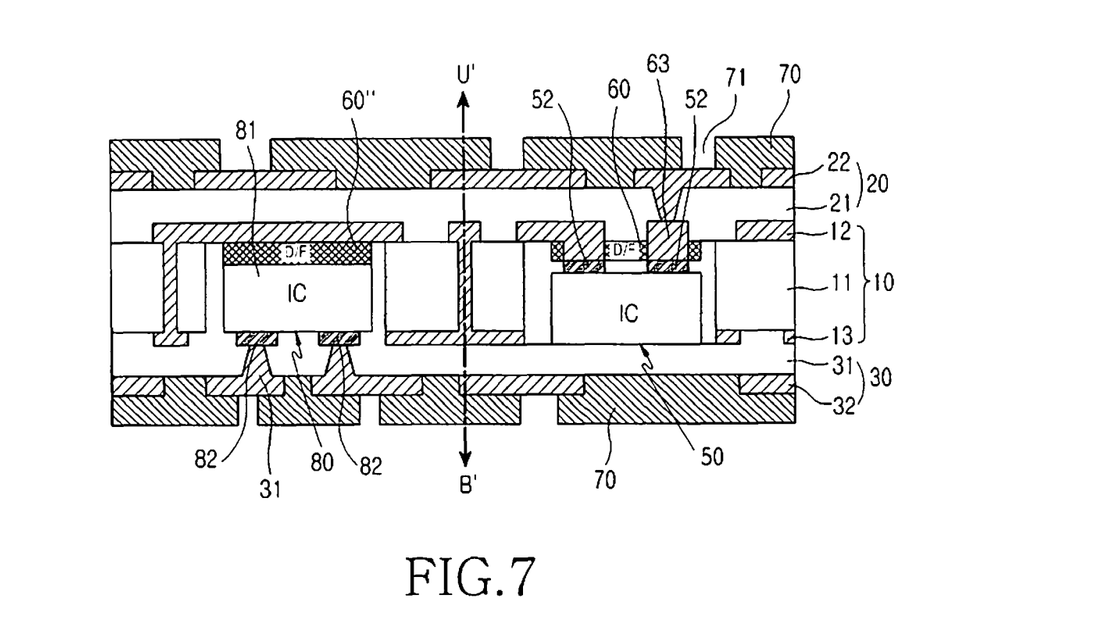
FIG. 7 is a sectional diagram of a PCB with built-in IC packages, according to a further embodiment of the present invention.

FIG. 7 is a sectional diagram of a PCB with built-in IC packages, according to a further embodiment of the present invention. In this embodiment, the PCB structures illustrated in FIGS. 1 and 4 are used in combination.

In the IC package 50 on the right side of a U'B' line, the conductive bumps 52 are connected to the core conductive layer 12 through the conductor layer 63 formed in a contact hole through the connection member 60. The IC package 50 is fanned out upward in the PCB. In an IC package 80 on the left side of the U'B' line, conductive bumps 82 are connected to the build-up conductive layer 32 through the via hole 31 formed in the build-up insulation layer 30 beneath the core layer 10. The IC package 80 is fanned out downward in the PCB.

FIGS. 8A to 8H are sectional diagrams sequentially illustrating a method for fabricating the PCB with the built-in IC packages illustrated in FIG. 7, according to an embodiment of the present invention.

Figure 8A:
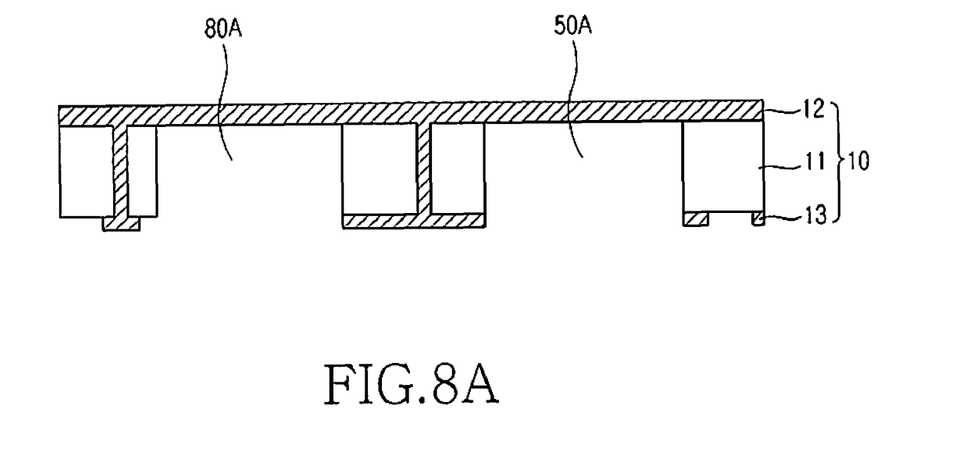
FIGS. 8A to 8H are sectional diagrams sequentially illustrating a method for fabricating the PCB with the built-in IC packages illustrated in FIG. 7, according to an embodiment of the present invention.

FIG. 8A illustrates the step of forming a circuit pattern on the core conductive layer 13 and then forming cavities 50A and 80A for accommodating the IC packages therein. An etching mask (not shown) is formed on the core conductive layer 13, and the core conductive layer 13 is eliminated from areas other than an intended circuit pattern by etching. This forms the circuit pattern of the conductive layer 13. The cavities 50A and 80A for the IC packages to be built in the PCB are formed by selectively eliminating the core insulation layer 11 in the general drilling process. Both the cavities 50A and 80A are opened in the same direction, for example, downward.

Figure 8B:
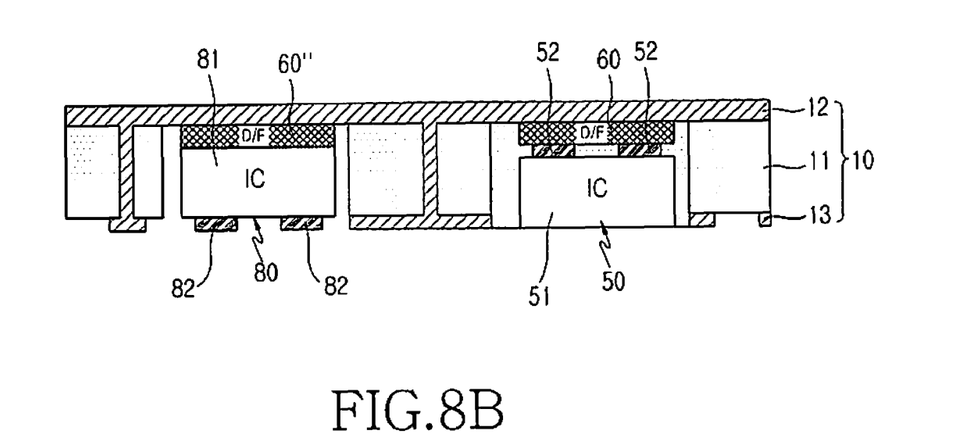

FIG. 8B illustrates the step of arranging the IC packages 50 and 80 inside the cavities 50A and 80A. The IC packages 50 and 80 are prepared having conductive bumps 52 and 82 on the top surface of the IC 51 and the bottom surface of an IC 81, respectively. The die attach film 60 is attached onto the conductive bumps 52 in the IC package 50. A die attach film 60" is attached onto a surface of the IC 81 that is free of the conductive bumps 82 in the IC package 80. The die attach films 60 and 60" are fixed to the core conductive layer 12.

Figure 8C:
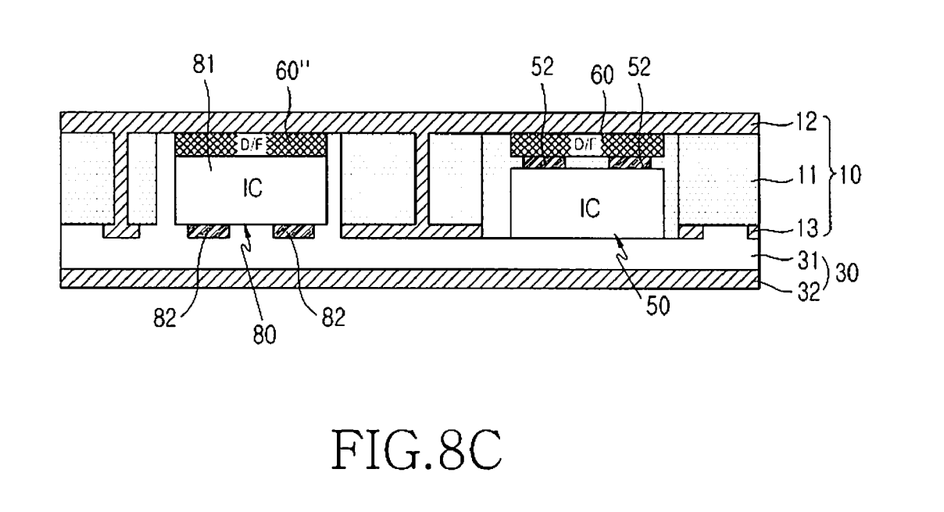

FIG. 8C illustrates the step of filling resin layers 53 and 83 into the cavities 50A and 80A to eliminate voids and then forming the build-up layer 30 on the bottom surface of the core conductive layer 13. The build-up layer 30 includes the build-up insulation layer 31, the via hole (not shown), and the build-up conductive layer 32, and is formed by the general build-up process.

Figure 8D:
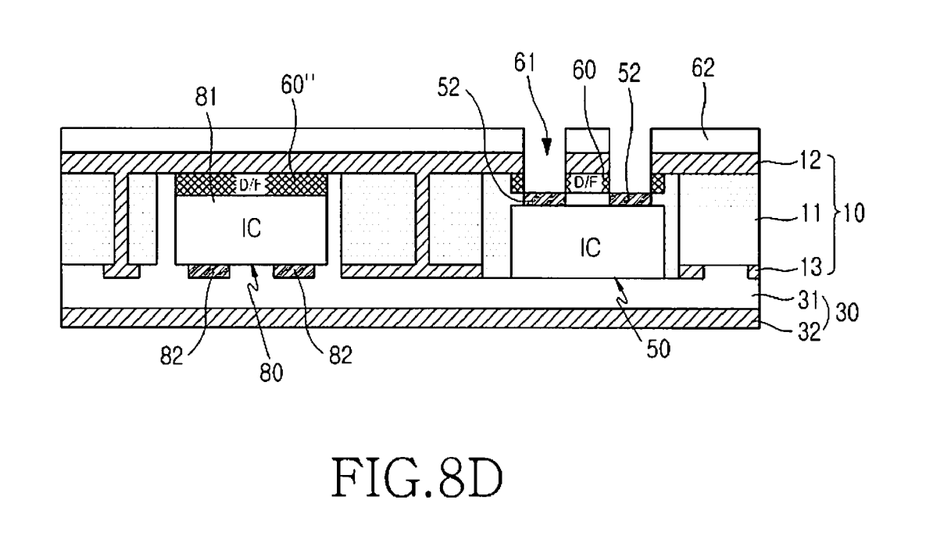

FIG. 8D illustrates the step of forming the contact holes 61 by eliminating portions of the die attach film 60 attached to the conductive bumps 52 and the conductive layer 12, thus exposing the top surfaces of the conductive bumps 52. The contact holes 61 are formed by the general photolithography process and the laser drilling process.

Figure 8E:
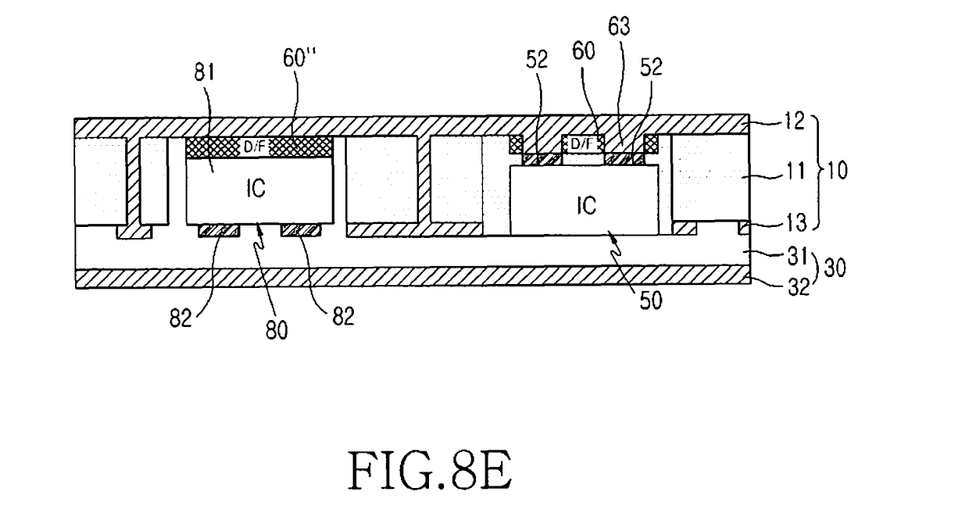

FIG. 8E illustrates the step of forming the connection conductors 63 formed of a conductive material (i.e. the conductor layer) in the contact holes 61 and eliminating the mask pattern 62.

Figure 8F:
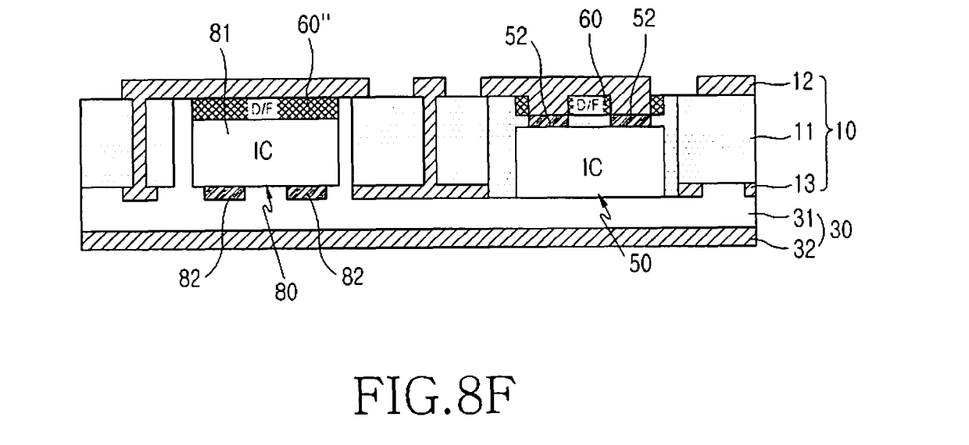

FIG. 8F illustrates the step of forming a circuit pattern by patterning the core conductive layer 12 on the core insulation layer 11. The circuit pattern of the core conductive layer 12 is formed in the same manner as the method for patterning a core conductive layer.

Figure 8G:
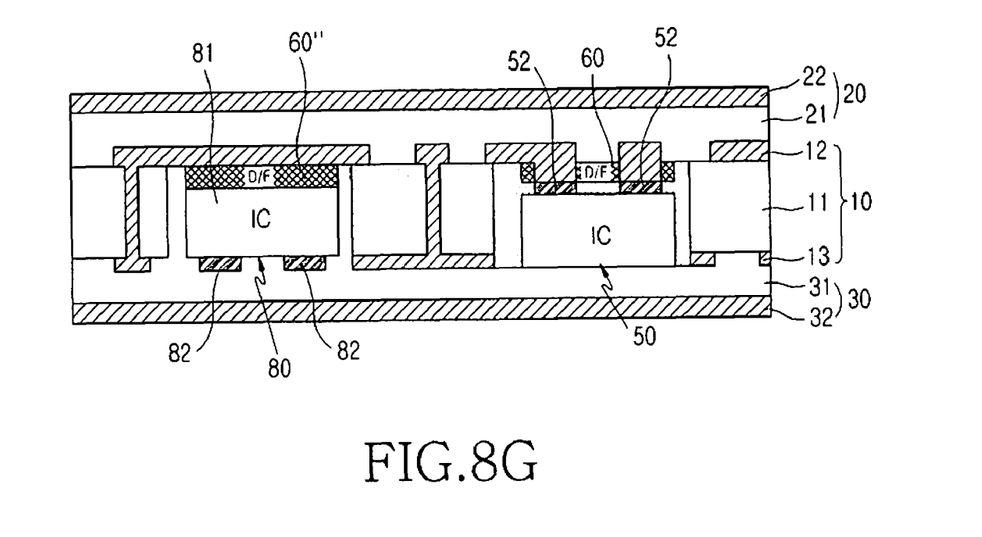

FIG. 8G illustrates the step of forming the build-up layer 20 on the core conductive layer 12.

Figure 8H:
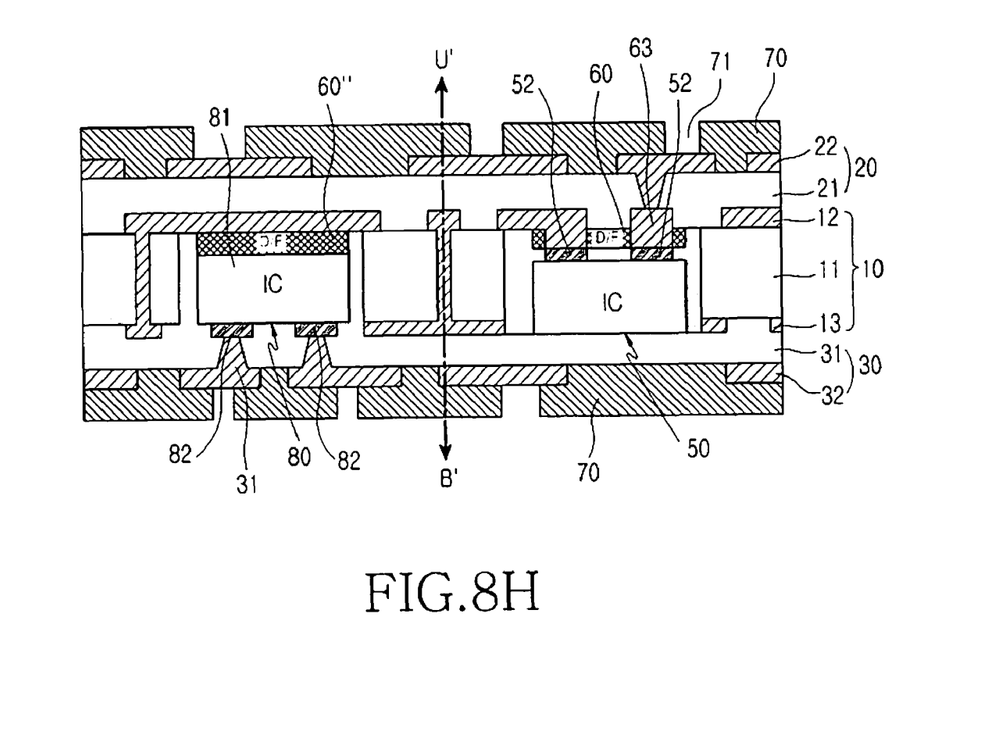

FIG. 8H illustrates the step of patterning the build-up conductive layers 22 and 32 according to intended circuit patterns. The solder resist layers 70 and the openings 71 are formed on the top surface of the build-up layer 20 and the bottom surface of the build-up layer 30, respectively. The PCB with the built-in IC packages is fabricated according to the present invention in this manner. When a PCB with more layers is to be fabricated, as many build-up layers as required are deposited on the top surface of the first build-up layer and on the bottom surface of the second build-up layer. The solder resist layers are then formed on the outermost conductive layers of the build-up layers.

When a structure in which conductive bumps are connected to a core conductive layer through a conductor layer formed in a contact hole through a connection member is used together with a structure in which conductive bumps arc connected to a build-up conductive layer through a via hole formed in a build-up insulation layer, the number of build-up layers is reduced and fabrication is simplified. Furthermore, the built-in direction of an IC package can be freely changed, taking into account an interconnection between the IC package and the outside.

As is apparent from the above description, the embodiments of the present invention utilize a core conductive layer as a fan-out layer. The resulting decrease in the number of build-up layers reduces the thickness and weight of a PCB, simplifies a fabrication process, and decreases fabrication cost.

In addition, the built-in direction of an IC package can be freely changed according to an interconnection between the IC package and the outside, thereby increasing wiring freedom during fan-out.

While the invention has been shown and described with reference to certain embodiments of the present invention thereof, it will be understood by those skilled in the art that various changes in form and detail may be made therein without departing from the spirit and scope of the present invention as defined by the appended claims and their equivalents.

What is claimed is:

1. A Printed Circuit Board (PCB) comprising:
at least one built-in Integrated Circuit (IC) package having a plurality of conductive bumps on an IC, wherein the plurality of conductive bumps are for external electrical connection and the IC package is accommodated within a core layer of a multi-layer PCB by a connection member on the IC;
a build-up insulation layer formed on the core layer; and
a build-up conductive layer formed on the build-up insulation layer,
wherein the connection member is formed between the conductive bumps and a first core conductive layer of the core layer with contact holes in contact with the conductive bumps, and at least one of the conductive bumps are electrically connected to the first core conductive layer through conductor layers formed in at least one of the contact holes, and
wherein a via hole is formed through the build-up insulation layer, and the build-up conductive layer is connected to one of the conductive bumps through a conductor layer formed in the via hole and a conductor layer formed in one of the contact holes.

2. The PCB of claim 1, wherein the core layer comprises a core insulation layer and first and second core conductive layers, wherein the first and second core conductive layers are formed on a top surface and a bottom surface of the core insulation layer.

3. The PCB of claim 2, wherein the core layer has a cavity and the IC package is accommodated within the cavity.

4. The PCB of claim 3, wherein the connection member is an insulative die attach film, and the die attach film is attached to both of the first core conductive layer and the conductive bumps.

5. The PCB of claim 4, wherein a gap of the cavity is filled with an insulation layer.

6. The PCB of claim 1, wherein a plurality of IC packages are formed and a built-in direction of conductive bumps on at least one of the IC packages differs by 180 degrees from built-in directions of conductive bumps on other IC packages.

7. The PCB of claim 1, wherein the connection member is formed on a surface of the IC opposite to a surface on which the conductive bumps are formed.

* * * * *